(12) United States Patent
Imai et al.

(10) Patent No.: US 8,237,361 B2
(45) Date of Patent: Aug. 7, 2012

(54) DISPLAY DEVICE WITH PROTECTIVE FILM HAVING A LOW DENSITY SILICON NITRIDE FILM BETWEEN HIGH DENSITY SILICON NITRIDE FILMS

(75) Inventors: Toshiaki Imai, Kanagawa (JP); Kaoru Abe, Kanagawa (JP); Shinji Kubota, Aichi (JP); Shinichiro Morikawa, Aichi (JP); Teiichiro Nishimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 444 days.

(21) Appl. No.: 12/096,487

(22) PCT Filed: Dec. 7, 2006

(86) PCT No.: PCT/JP2006/324448
§ 371 (c)(1),
(2), (4) Date: Jun. 6, 2008

(87) PCT Pub. No.: WO2007/066719
PCT Pub. Date: Jun. 14, 2007

(65) Prior Publication Data
US 2009/0309486 A1  Dec. 17, 2009

(30) Foreign Application Priority Data

Dec. 7, 2005  (JP) .................... 2005-352887
Nov. 29, 2006  (JP) .................... 2006-322104

(51) Int. Cl.
*H01L 51/00* (2006.01)
(52) U.S. Cl. ........................................ 313/512
(58) Field of Classification Search .................. None
See application file for complete search history.

(56) References Cited

U.S. PATENT DOCUMENTS

| | | | | |
|---|---|---|---|---|
| 7,772,662 B2* | 8/2010 | Murata et al. | ................. | 257/421 |
| 2005/0258443 A1* | 11/2005 | Yamazaki et al. | ............. | 257/93 |
| 2006/0046502 A1* | 3/2006 | Ngo et al. | .................... | 438/757 |
| 2008/0290372 A1* | 11/2008 | Makiyama | ................... | 257/194 |
| 2009/0108367 A1* | 4/2009 | Yokoyama | ................... | 257/369 |
| 2009/0224293 A1* | 9/2009 | Miyanami | .................... | 257/288 |

FOREIGN PATENT DOCUMENTS

| | | |
|---|---|---|
| CN | 1347265 A | 5/2002 |
| JP | 2000-223264 | 8/2000 |

(Continued)

OTHER PUBLICATIONS

International Search Report dated Dec. 7, 2005.

*Primary Examiner* — Anh Mai
*Assistant Examiner* — Britt D Hanley
(74) *Attorney, Agent, or Firm* — SNR Denton US LLP

(57) ABSTRACT

There is provided a display capable of protecting a light-emitting device by a protective film having good sealing characteristics and sidewall step coverage and preventing deterioration of the light-emitting device, thereby maintaining good display characteristics. A display device 1 including an organic electroluminescence device 3 provided on a substrate 2 and protected by a protective film 4 is characterized in that the protective film 4 is composed of silicon nitride films 4a, 4b, and 4c formed in layers by a chemical vapor deposition method using an ammonia gas, the high-density silicon nitride film 4c is provided in a surface layer of the protective film 4, and the low-density silicon nitride film 4b having a lower density than that of the high-density silicon nitride film 4c is provided below it.

7 Claims, 8 Drawing Sheets

FOREIGN PATENT DOCUMENTS

| | | |
|---|---|---|
| JP | 2004-063304 | 2/2004 |
| JP | 2004-349152 | 12/2004 |
| JP | 2005-222778 | 8/2005 |
| JP | 2005-222778 A | 8/2005 |
| JP | 2005-285659 | 10/2005 |
| JP | 2006-338947 | 12/2006 |

* cited by examiner (A)

(B)

DISPLAY DEVICE WITH PROTECTIVE FILM HAVING A LOW DENSITY SILICON NITRIDE FILM BETWEEN HIGH DENSITY SILICON NITRIDE FILMS

TECHNICAL FIELD

The present invention relates to a display and particularly to a display including organic electroluminescence devices which are covered with a protective film.

BACKGROUND ART

An organic electroluminescence device including an organic layer which is provided between an anode and a cathode and in which an organic hole transport layer and an organic luminescent layer are laminated attracts attention as a light-emitting device capable of high-luminance emission by low-voltage DC driving. However, the organic electroluminescence device has the problem of low stability with passage of time, such as reduction in luminance and destabilization of emission due to moisture absorption. Therefore, in a display using an organic electroluminescence device, the organic electroluminescence device is covered with a protective film in order to prevent moisture from reaching the organic electroluminescence device.

As such a protective film, an inorganic material film, for example, a silicon nitride film, is used. In order to form this silicon nitride film, it has been proposed to use a plasma CVD method using only $SiH_4$ (silane) gas and $N_2$ (nitrogen) gas as raw material gases without using ammonia ($NH_3$) gas. When such a silicon nitride film formed as described above is used as the protective film, cracking or separation does not occur in the protective film, and the operation of the organic electroluminescence device is also stabilized (refer to Japanese Unexamined Patent Application Publication No. 2000-223264 (particularly, paragraphs 0021-0022)).

Also, there has been proposed a constitution in which in a deposition method using $SiH_4$ (silane) gas, $N_2$ (nitrogen) gas, and $H_2$ (hydrogen) gas as raw material gases, the film density is controlled by changing the nitrogen gas concentration to form a three-layer structure including a high-density silicon nitride film held between low-density silicon nitride films, thereby decreasing residual stress in the protective film and preventing film separation (refer to Japanese Unexamined Patent Application Publication No. 2004-63304 (particularly, paragraphs 0014-0015)).

However, the silicon nitride film formed without using ammonia ($NH_3$) gas as a raw material gas as described above exhibits low transmittance for blue light near a wavelength of 450 nm. Therefore, in a so-called top emission-type display in which light emitted from an organic electroluminescence device is transmitted through the protective film and taken out from the side opposite to a substrate, the emission efficiency of blue light is decreased, thereby decreasing color reproducibility of a full-color display.

On the other hand, when a silicon nitride film formed by the CVD method using ammonia ($NH_3$) gas as a raw material gas is used as the protective film, it is necessary to increase the density of the silicon nitride film by decreasing the deposition rate. However, such a high-density silicon nitride film has low sidewall step coverage and causes a dark spot, thereby causing a defective product. Further, since the deposition rat is low, the manufacturing cost is increased.

Further, when the deposition rate is set to a high value, a decrease in sealing properties of the silicon nitride film causes a reduction in emission lifetime of the device, a reduction in chromaticity, and an increase in driving electric power. In addition, there is a problem in which foreign matter of 50 nm to 300 nm adheres to a surface of the film, thereby failing to maintain quality stability of the protective film.

Accordingly, an object of the present invention is to provide a display in which a light-emitting device can be protected by a protective film having high sealing characteristics and sidewall step coverage and no substance adhering to a surface thereof so that deterioration in the light-emitting device and the occurrence of a dark spot can be prevented, thereby maintaining good display characteristics due to emitted light which is taken out from the protective film side.

DISCLOSURE OF INVENTION

In order to achieve the object, a display of the present invention is configured to include a light-emitting device provided on a substrate and protected by a protective film, and particularly characterized in that the protective film is composed of a laminate of silicon nitride films having different film densities and deposited by a chemical vapor deposition method using an ammonia gas, and a silicon nitride film of a surface layer in the protective film is configured to have a higher density than that of a lower silicon nitride film.

In the display having the above-described constitution, a silicon nitride film formed by the chemical vapor deposition method using an ammonia gas is used as the protective film, and thus blue light emitted from the light-emitting device is taken out from the protective film side without being attenuated. Also, the silicon nitride film constituting the surface layer of the protective film has a higher density than that of a lower layer, thereby improving sealing characteristics. On the other hand, a lower silicon nitride film has a lower density than that of an upper layer. Such a low-density film is mainly formed by a vapor phase reaction and thus has good sidewall step coverage. Therefore, the light-emitting device is protected by the protective film with good sealing characteristics and good sidewall step coverage. In addition, since the surface layer in the protective film is composed of a high-density silicon nitride film, i.e., a film mainly formed by a surface reaction, adhesion of foreign matter to the surface can be prevented as compared with when film deposition is terminated under a condition in which a vapor phase reaction mainly proceeds at a high deposition rate.

As described above, the display of the present invention has good sealing characteristics and good sidewall step coverage and is capable of protecting the light-emitting device by the protective film with no adhesion of foreign matter to the surface of the film, thereby preventing deterioration in the light-emitting device and the occurrence of a dark spot and maintaining good display characteristics due to emitted light which is taken out from the protective film side.

BEST MODE FOR CARRYING OUT THE INVENTION

An embodiment of the present invention will be described in detail below with reference to the drawings.

Figure 1:
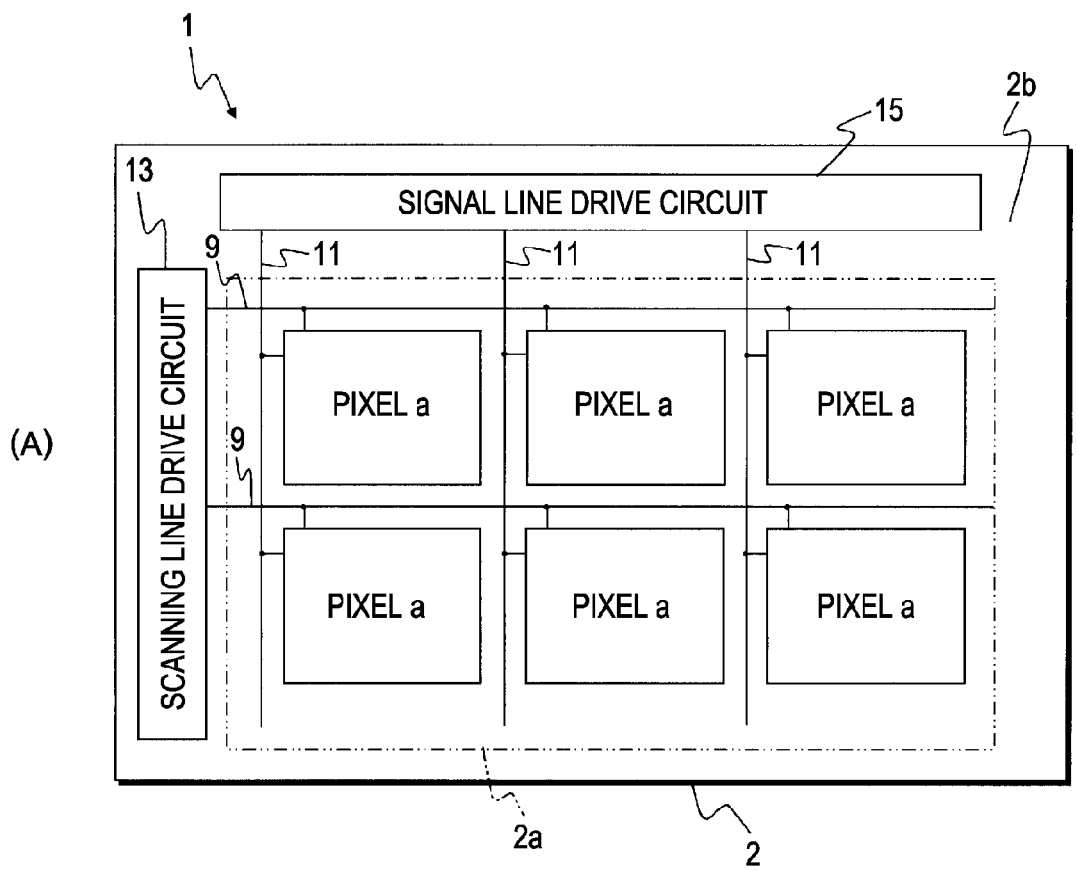
FIG. 1 is a drawing illustrating outlines of a display according to an embodiment, FIG. 1(A) being a schematic block diagram, and FIG. 1(B) being a block diagram of a pixel circuit.
Figure 1:
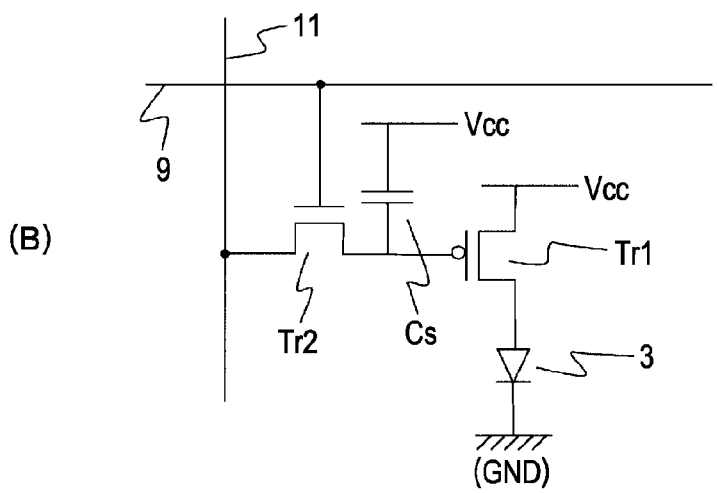

FIG. 1 is a drawing showing an example of a display according to an embodiment, FIG. 1(A) being a schematic block diagram, and FIG. 1(B) being a block diagram of a pixel circuit. Herein, description is made of an embodiment in which the present invention is applied to an active matrix type display 1 using an organic electroluminescent device 3 as a light-emitting device.

As shown in FIG. 1(A), a display region 2a and a peripheral region 2b are set on a substrate 2 of the display 1. In the display region 2a, a plurality of scanning lines 9 and a plurality of signal lines 11 are disposed in a lattice form, and a pixel a is provided corresponding to each of the intersections of the scanning lines and the signal lines to form a pixel array. An organic electroluminescence element is provided on each of the pixels a. In the peripheral region 2b, a scanning line driving circuit 13 for scanning and driving the scanning lines 9 and a signal line driving circuit 15 for supplying vides signals (i.e., input signals) to the signal lines 11 according to luminance information are disposed.

As shown in FIG. 1(B), a pixel circuit provided on each of the pixels a is composed of, for example, an organic electroluminescence device 3, a driving transistor Tr1, a write transistor (sampling transistor) Tr2, and a holding capacitor Cs. Therefore, video signals input from the signal lines 11 through the write transistors Tr2 by the drive by the scanning line driving circuit 13 are held in the holding capacitors Cs, currents corresponding to the amounts of held signals are supplied to the organic electroluminescence elements 3, resulting in light emission from the organic electroluminescence elements 3 with luminance according to the current values.

In addition, the above-described configuration of a pixel circuit is only an example, and a capacitor element may be provided in the pixel circuit according to demand or a plurality of transistors may be further provided to configure the pixel circuit. Further, a necessary driving circuit is added according a change in the pixel circuit.

Figure 2:
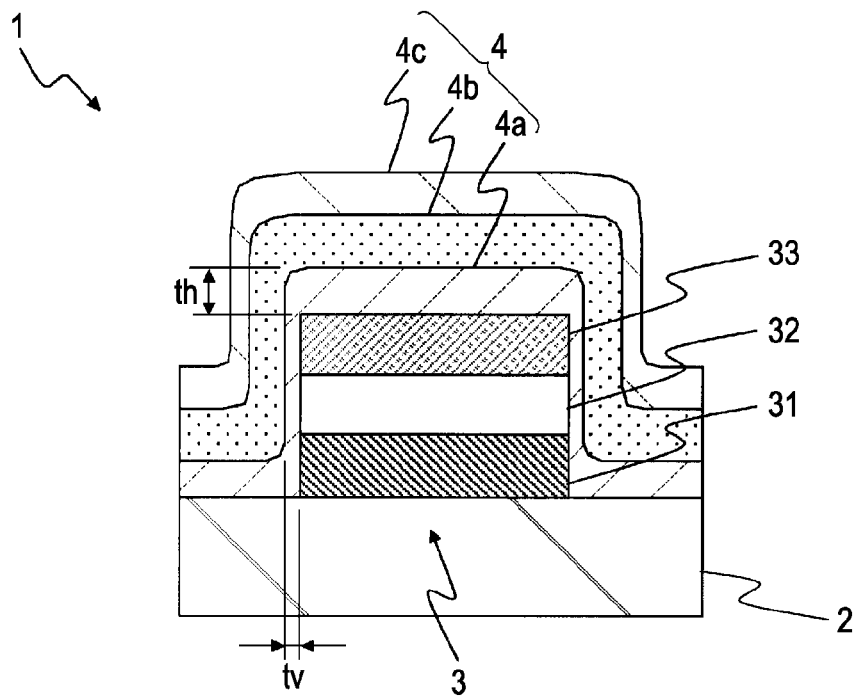
FIG. 2 is a sectional view showing a configuration of a principal portion of a display according to an embodiment

Next, the sectional configuration of a principal portion of the display 1 is described on the basis of FIG. 2. FIG. 2 is a sectional view of a configuration of a principal portion, showing a portion corresponding to one of the organic electroluminescence devices 3 provided in the display region. As shown in this figure, the display 1 is configured such that a plurality of the organic electroluminescence device 3 provided on the display region of the substrate 2 is covered with a protective film 4. In addition, the protective film 4 is provided to cover the whole of the display region in which the organic electroluminescence devices 3 are provided.

Each of the organic electroluminescence devices 3 include, for example, an anode 31, an organic layer 32 including at least a luminescent layer, and a cathode 33, which are laminated in that order. In such an organic electroluminescence device 3, the anode 31 disposed on the substrate 2 side is composed of a reflecting material, and the cathode 33 is composed of a light-transmitting material. Therefore, the display 1 is configured as a so-called top emission type in which light emitted in the organic layer 32 is transmitted through the cathode 33 on the side opposite to the substrate 2 and then taken out.

Further, the protective film 4 which covers the organic electroluminescence devices 3 has a configuration characteristic of the present invention.

Namely, the protective film 4 is made of a silicon nitride film formed by a chemical vapor deposition method (CVD method) using an ammonia gas, particularly, a plasma CVD method. In addition, the protective film 4 is configured to have a three-layer structure in which a high-density silicon nitride film 4a, a low-density silicon nitride film 4b, and a high-density silicon nitride film 4c are laminated in that order.

The high-density silicon nitride films 4a and 4c are films with a higher density than that of the low-density silicon nitride film 4b, and the low-density silicon nitride film 4b is a film with a lower density than that of the high-density silicon nitride films 4a and 4c. The difference in film density between the high-density silicon nitride films 4a and 4c and the low-density silicon nitride film 4b is preferably $0.4 \times 10^{22}$ [atoms/cm$^3$] or more.

Further, the film density of the high-density silicon nitride films 4a and 4c is preferably $6.2 \times 10^{22}$ [atoms/cm$^3$] or more. However, the density of the high-density silicon nitride film 4a which covers directly the organic electroluminescence devices 3 need not be the same as that of the high-density silicon nitride film 4c on the outermost surface. On the other hand, the film density of the low-density silicon nitride film 4b is preferably $5.8 \times 10^{22}$ [atoms/cm$^3$] or less.

Further, the silicon nitride films 4a, 4b, and 4c having different densities have different moisture permeability coefficients. Namely, as the film density increases, the moisture permeability coefficient is suppressed to a low value to improve sealing characteristics (passivation characteristics). From this viewpoint, the moisture permeability coefficients of the high-density silicon nitride films 4a and 4c are preferably less than $8.0 \times 10^{-4}$ [g·mm/m$^2$·d]. As described above, when the film density of the high-density silicon nitride films 4a and 4c is $6.2 \times 10^{22}$ [atoms/cm$^3$] or more, the moisture permeability coefficient can be suppressed to a low value to maintain a high sealing ability. On the other hand, the low-density silicon nitride film 4b having a film density of $5.8 \times 10^{22}$ [atoms/cm$^3$] or less has a moisture permeability coefficient of $8.0 \times 10^{-4}$ [g·mm/m$^2$·d] or more.

The film density of each of the above-described silicon nitride films 4a, 4b, and 4c is controlled by the deposition conditions for forming the film by the CVD method. Namely, in the CVD method, film deposition proceeds by a surface reaction on a deposition surface and a vapor phase reaction in a deposition atmosphere. In this process, for example, when the flow rate of a raw material gas is increased to increase the vapor phase reaction, the deposition rate is increased, and the film density is decreased. On the other hand, when the flow rate of a raw material gas is decreased to increase the surface reaction, the deposition rate is decreased, and the film density is increased.

In this case, an ammonia ($NH_3$) gas is used for depositing the silicon nitride films 4a, 4b, and 4c, and a silane ($SiH_4$) gas is further used as another raw material gas. Therefore, these silicon nitride films 4a, 4b, and 4c are formed as films in each of which the film density is controlled by controlling the total flow rate of ammonia gas and silane gas.

Namely, the high-density silicon nitride films 4a and 4c are films formed by the CVD method in which the surface reaction mainly proceeds at a relatively low deposition rate. On the other hand, the low-density silicon nitride film 4b is a film formed by the CVD method in which the vapor phase reaction mainly proceeds at a high deposition rate in comparison to the high-density silicon nitride film 4a.

In addition, the vapor phase reaction and the surface reaction in CVD film deposition are controlled by, for example, the substrate temperature and the gas pressure in the deposition atmosphere as well as the flow rate of the raw material gases. In this case, for example, the vapor phase reaction is enhanced by decreasing the substrate temperature or increasing the gas pressure in the deposition atmosphere, and consequently the deposition rate is increased to decrease the film density.

Further, film deposition by the above-described CVD method causes a difference in sidewall step coverage according to the film deposition conditions. In other words, a lower-density film formed mainly by the vapor phase reaction has increased sidewall step coverage. As described above, when the film density of the low-density silicon nitride film 4b is $5.8 \times 10^{22}$ [atoms/cm$^3$] or less, the sidewall step coverage (top film thickness/sidewall film thickness) th/tv≧⅔ can be obtained. On the other hand, the high-density silicon nitride films 4a and 4c having a film density of $6.2 \times 10^{22}$ [atoms/cm$^3$] or more has the sidewall step coverage th/tv<⅔. The sidewall step coverage refers to coverage of a step having a taper angle of 90° and a height of 1 μm.

Further, when film deposition by the above-described CVD method is terminated under a condition in which the vapor phase reaction mainly proceeds at a high deposition rate, foreign matter of 50 nm to 300 nm easily adheres to the film surface. From this viewpoint, the outermost surface of the protective film 4 is composed of the high-density silicon nitride film 4c formed under a condition in which the surface reaction mainly proceeds at a relatively low deposition rate. Further, in order to prevent the adhesion of foreign matter to the surface of the low-density silicon nitride film 4b formed under a condition in which the vapor phase reaction mainly proceeds, the high-density silicon nitride film 4c in the outermost surface is a film formed continuously after the deposition of the low-density silicon nitride film 4b. The continuous deposition is deposition performed in the same deposition atmosphere without opening to air and, preferably, deposition performed by continuously changing the flow rate of a raw material gas without termination of deposition.

The above-described characteristics of the silicon nitride films formed by the plasma CVD method are classified by the film density as follows: First, the high-density silicon nitride films 4a and 4c have 1) good sealing characteristics, 2) a low deposition rate, 3) little deposition of foreign matter to the surfaces, and 4) low sidewall step coverage. On the other hand, the low-density silicon nitride film 4b has 1) poor sealing characteristics, 2) a high deposition rate, 3) ease of deposition of foreign matter to the surfaces, and 4) high sidewall step coverage.

Figure 3:
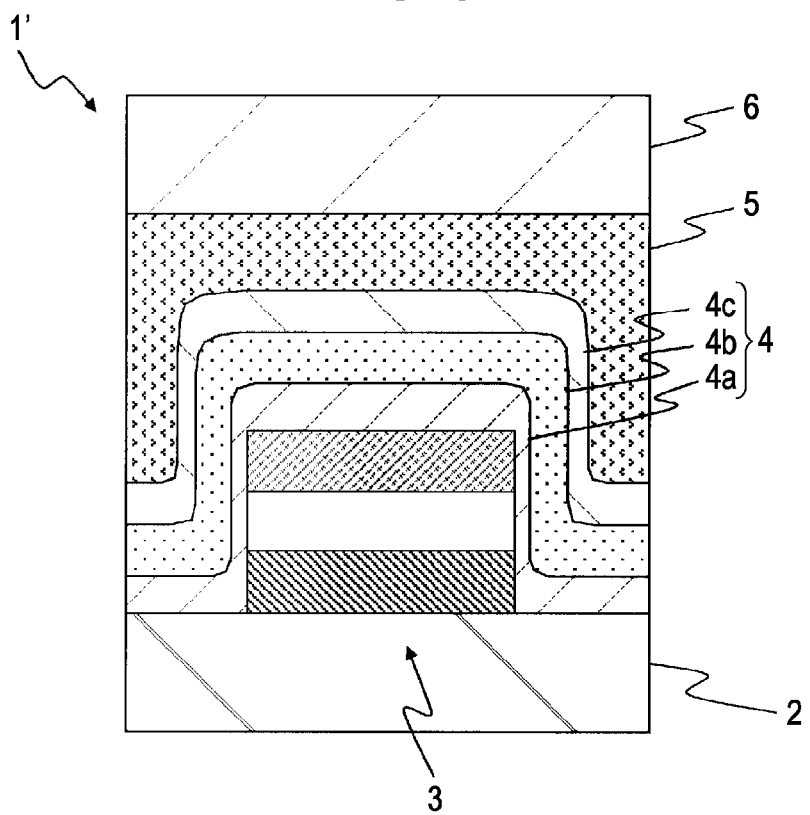
FIG. 3 is a sectional view showing another configuration of a principal portion of a display according to an embodiment

FIG. 3 is a sectional view showing a configuration of a principal portion of a display 1' having another configuration according to an embodiment. As shown in this figure, the display 1' may be configured such that the protective film 4 described above is further covered with a resin 5 and a sealing substrate 6 is bonded through the resin 5. As such a resin 5, for example, an epoxy resin is used.

The resin 5 improves the sealing characteristics by covering the entire surface of the substrate 2, but the resin 5 may be provided to cover a portion of the substrate 2 as long as the sealing substrate 6 is sufficiently bonded. However, the periphery of the substrate 2 is preferably completely covered with the resin 5 without the peripheral edge of the protective film 4 being exposed. The sealing substrate 6 is composed of a light-transmitting material, and it may be a plastic substrate or a glass substrate. In addition, another thin film having light transmissivity may be provided between the protective film 4 and the sealing substrate 6.

Since, as described above, each of the displays 1 and 1' according to the embodiment uses, as the protective film 4, a silicon nitride film formed by the CVD method using an ammonia gas, blue light emitted from the organic electroluminescence devices 3 can be taken out from the protective film 4 side without being attenuated. Therefore, the top emission-type display 1 is capable of display with good color reproducibility.

In addition, the protective film 4 is configured to cover the organic electroluminescence devices 3 with the high-density silicon nitride film 4a, the low-density silicon nitride film 4b, and the high-density silicon nitride film 4c, which are laminated in that order from below. Therefore, the high-density silicon nitride films 4a and 4c maintain good sealing characteristics. On the other hand, the low-density silicon nitride film 4b maintains good sidewall step coverage. As a result, the protective film 4 can protect the organic electroluminescence devices 3 with good sealing characteristics and good sidewall step coverage, thereby preventing deterioration of the organic electroluminescence devices 3 due to moisture penetration.

Further, since the surface layer constituting the outermost surface of the protective film 4 is composed of the high-density silicon nitride film 4c, the formation of the protective film 4 is terminated under a deposition condition in which the surface reaction mainly proceeds, thereby preventing the adhesion of foreign matter to the surface of the protective film 4. In particular, the high-density silicon nitride film 4c in the surface layer of the protective film 4 is a film formed in succession to the deposition of the low-density silicon nitride film 4b, and thus film deposition is not suspended at the time the vapor phase reaction mainly proceeds for forming the low-density silicon nitride film 4b. Therefore, the adhesion of foreign matter to the surface of the low-density silicon nitride film 4b can be prevented, and the organic electroluminescence devices 3 can be covered with the protective film 4 of high quality.

As a result, the organic electroluminescence devices 3 can be covered with the protective film 4 having good sealing characteristics and sidewall step coverage and no adhesion of foreign matter to the surface thereof. Consequently, deterioration in the organic electroluminescence devices 3 and the occurrence of a dark spot can be prevented, and good display characteristics due to emitted light which is taken out from the protective film 4 side can be maintained.

In addition, the deposition rate over the entire protective film can be increased as compared when a protective film includes only a high-density silicon nitride film, and thus productivity can also be improved.

In particular, as shown in FIG. 3, the configuration in which the sealing substrate 6 is bonded through the resin 5 is capable of preventing moisture penetration into the organic electroluminescence devices 3 and thus more securely preventing deterioration in the organic electroluminescence devices 3 due to moisture.

In each of the displays of the embodiments described with reference to FIGS. 2 and 3, the protective film 4 is described as having a three-layer structure including the high-density silicon nitride film 4a, the low-density silicon nitride film 4b, and the high-density silicon nitride film 4c. However, the protective film may have a multilayer structure in which silicon nitride films are further laminated as long as the outermost surface is composed of a high-density silicon nitride film, and a lower-density silicon nitride film is provided as a lower layer. However, in order to securely seal the organic electroluminescence devices 3, the lowermost layer is preferably a high-density silicon nitride film.

Figure 4:
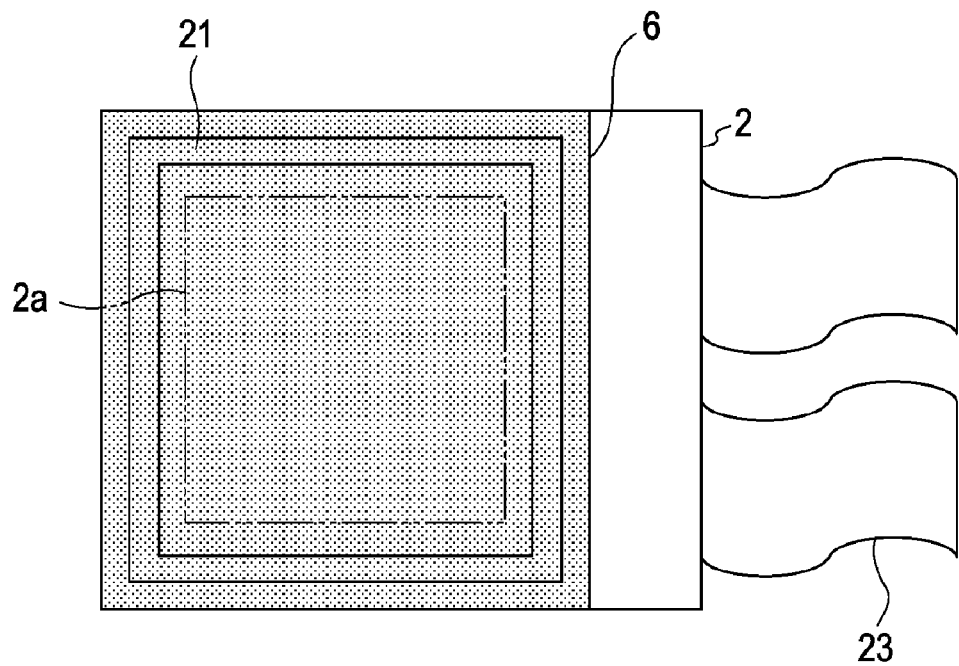
FIG. 4 is a view showing a configuration of a module-shaped display with a sealed configuration to which the present invention is applied.

In addition, a display according to the present invention includes a module form having a sealed structure as shown in FIG. 4. For example, this module form corresponds to a display module in which a sealing portion 21 is provided to surround a display region 2a serving as a pixel array portion, and a counter portion (sealing substrate 6) composed of transparent glass or the like is bonded with the sealing portion 21 used as an adhesive. In this case, a color filter, a protective film, a light shielding film, and the like may be provided on the sealing substrate 6. Further, a flexible printed board 23 may be provided on the substrate 2 used as a display module in which the display region 2a is formed, in order to input and output signals to and from the display region 2a (pixel array portion) from the outside.

Further, the above-described display of the present invention can be applied to displays of electronic apparatuses in various fields, e.g., a digital camera, a notebook-size personal computer, a cellular phone, a video camera, and the like, in each of which video signals input to the electronic apparatus or produced therein are displayed as an image or a video picture, and the display can be widely applied to display portions in electric products using an electrooptic technique.

Hereinafter, examples of electronic apparatuses to which the display is applied are described.

Figure 5:
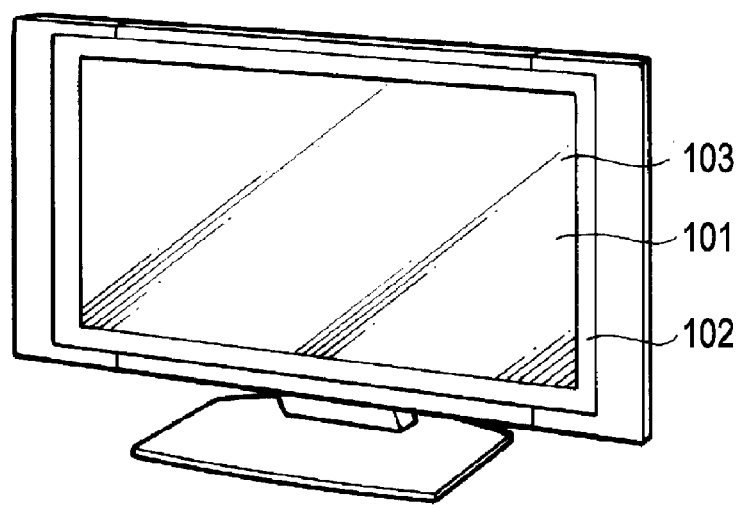
FIG. 5 is a perspective view showing a television to which the present invention is applied.

FIG. 5 is a perspective view showing a television to which the present invention is applied. The television of this application example includes a video display screen portion 101 including a front panel 102, a filter glass, 103, and the like, and the television is formed using the display according to the present invention as the display screen portion 101.

Figure 6:
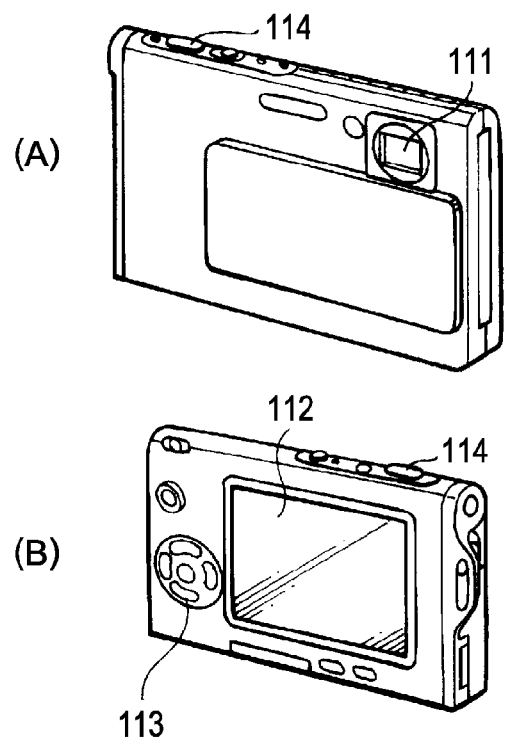
FIG. 6 is a perspective view showing a digital camera to which the present invention is applied, FIG. 6(A) being a perspective view from the front side, and FIG. 6(B) being a perspective view from the back side.

FIG. 6 is a perspective view showing a digital camera to which the present invention is applied, FIG. 6(A) being a perspective view from the front side, and FIG. 6(B) being a perspective view from the back side. The digital camera of this application example includes a luminescent portion 111 for flush, a display portion 112, a menu switch 113, a shutter button 114, and the like, and the digital camera is formed using the display according to the present invention as the display portion 112.

Figure 7:
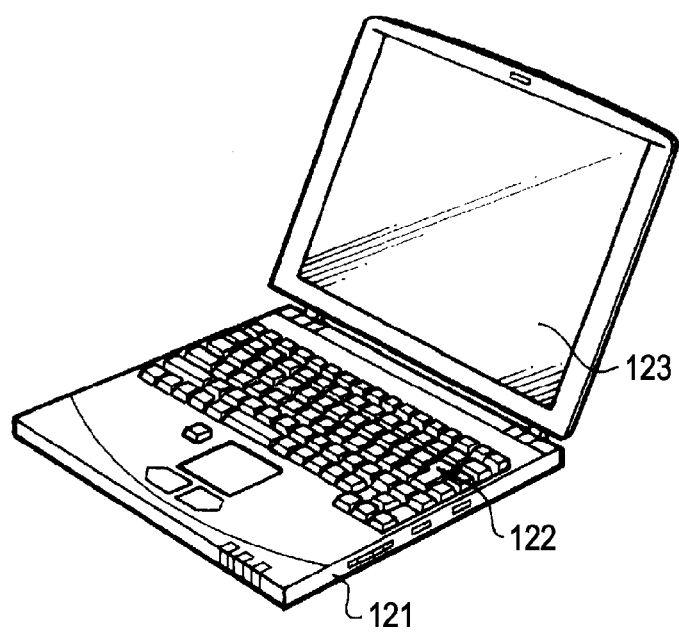
FIG. 7 is a perspective view showing a notebook-size personal computer to which the present invention is applied.

FIG. 7 is a perspective view showing a notebook-size personal computer to which the present invention is applied. The notebook-size personal computer of this application example includes a body 121, a keyboard 122 operated when a character or the like is input, a display portion 123 for displaying images, and the like, and the notebook-size personal computer is formed using the display according to the present invention as the display portion 123.

Figure 8:
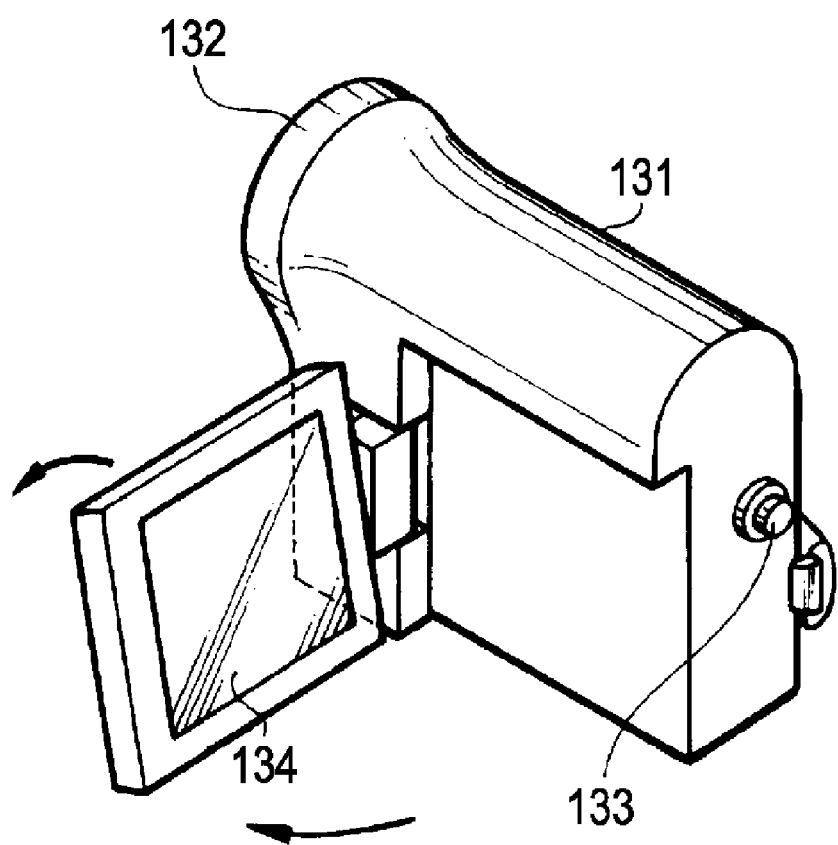
FIG. 8 is a perspective view showing a video camera to which the present invention is applied.

FIG. 8 is a perspective view showing a video camera to which the present invention is applied. The video camera of this application example includes a body portion 131, an object taking lens 132 provided on the front side, a photographing start/stop switch 133, a display portion 134, and the like, and the video camera is formed using the display according to the present invention as the display portion 134.

Figure 9:
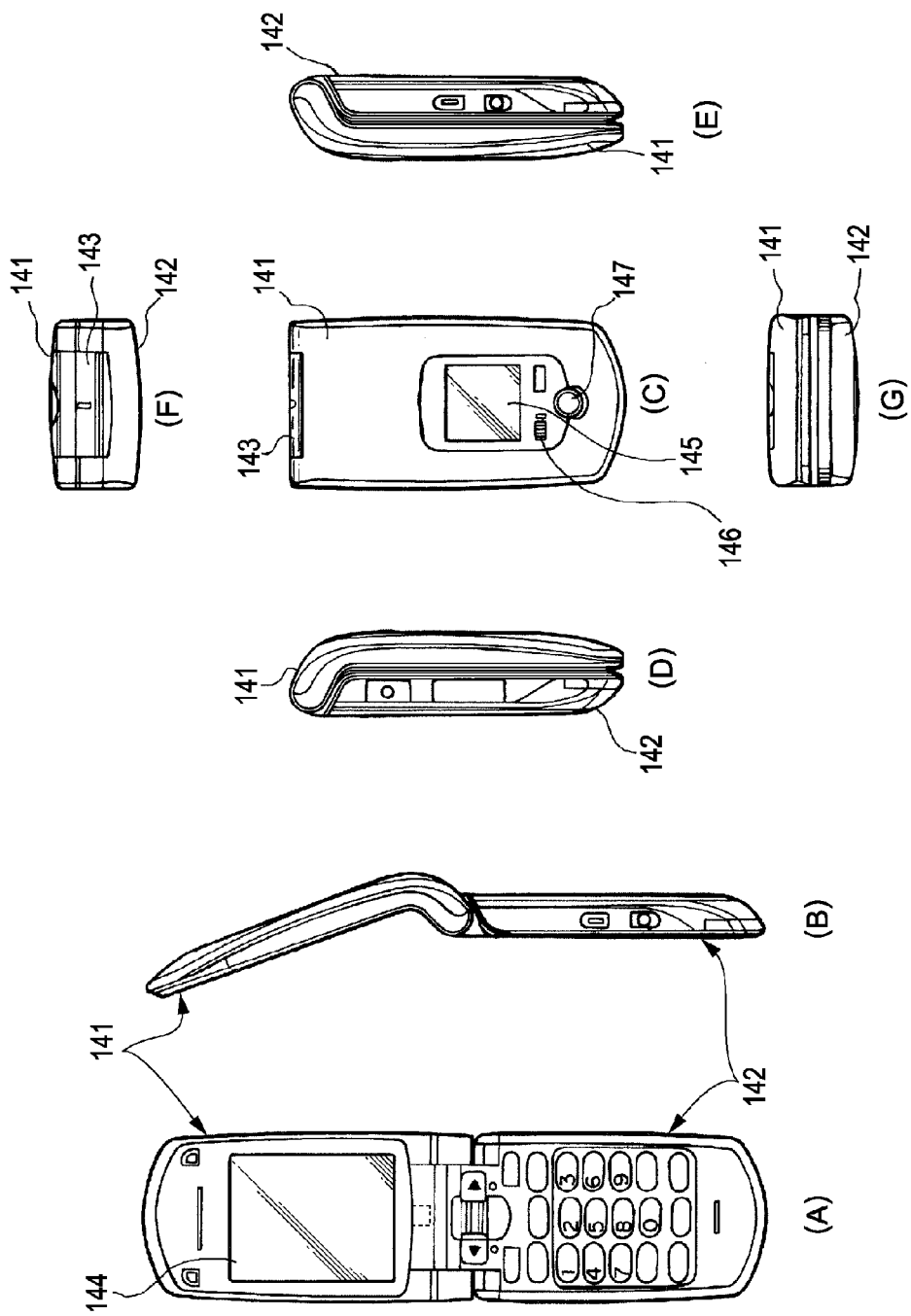
FIG. 9 is a view showing a mobile terminal device to which the present invention is applied, FIG. 9(A) being a front view in an open state, FIG. 9(B) being a side view, FIG. 9(C) being a front view in a closed state, FIG. 9(D) being a left side view, FIG. 9(E) being a right side view, FIG. 9(F) being a top view, and FIG. 9(G) being a bottom view.

FIG. 9 is a perspective view showing a mobile terminal device, e.g., a cellular phone, to which the present invention is applied, FIG. 9(A) being a front view in an open state, FIG. 9(B) being a side view, FIG. 9(C) being a front view in a closed state, FIG. 9(D) being a left side view, FIG. 9(E) being a right side view, FIG. 9(F) being a top view, and FIG. 9(G) being a bottom view. The cellular phone of this application example includes an upper casing 141, a lower casing 142, a connection portion (in this case, a hinge portion) 143, a display 144, a sub-display 145, a picture light 146, a camera 147, and the like, and the cellular phone is formed using the display according to the present invention as the display 144 and the sub-display 145.

EXAMPLES

Comparative Example

Figure 10:
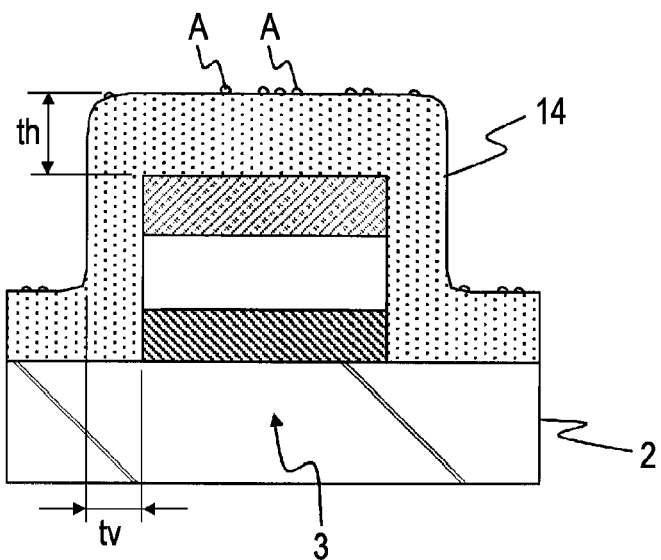
FIG. 10 is a sectional view of a configuration of a principal portion, showing a configuration of each of samples 1 to 4 in a comparative example.

As shown in FIG. 10, each sample in which an organic electroluminescence device 3 formed on a substrate 2 was covered with a single silicon nitride film 14 was prepared as a comparative sample.

As shown in Table 1 below, samples 1 to 4 were prepared by forming silicon nitride films 14 having different film densities under different conditions 1 to 4, respectively. The silicon nitride film 14 of each of the samples 1 to 4 was formed by the plasma CVD method using ammonia ($NH_3$) gas and silane ($SiH_4$) gas as raw material gases. In this case, the silicon nitride films 14 having different film densities were formed under the respective conditions 1 to 4 in each of which the total flow rate of the ammonia and silane gases was controlled.

TABLE 1

|  |  | Film density [atoms/cm$^3$] | Step coverage (coverage) | Lifetime |
|---|---|---|---|---|
| Sample 1 | Condition 1 | 7.1E+22 | × (0.640) | Δ |
| Sample 2 | Condition 2 | 6.5E+22 | × (0.646) | ○ |
| Sample 3 | Condition 3 | 5.7E+22 | ○ (0.689) | × |
| Sample 4 | Condition 4 | 5.2E+22 | ○ (0.713) | × |
| Example 1 | Condition 2/Condition 3/Condition 2 |  |  | ○ |

The step coverage of the silicon nitride film 14 and the lifetime of the organic electroluminescence device 3 were measured for each of the samples 1 to 4.

As shown in Table 1, it was confirmed that in the samples 3 and 4 in each of which the film density of the silicon nitride film 14 is $5.8 \times 10^{22}$ [atoms/cm$^3$] or less, which is a preferred condition for the low-density silicon nitride film in the above-described embodiment, the sidewall step coverage (top film thickness/sidewall film thickness) th/tv≧⅔ (0.67) is obtained, and good coverage is secured.

It was also confirmed that in the samples 1 and 2 in each of which the film density of the silicon nitride film 14 is $6.2 \times 10^{22}$ [atoms/cm$^3$] or more, which is a preferred condition for the high-density silicon nitride film in the above-described embodiment, the lifetime of the organic electroluminescence device 3 is better than the samples 3 and 4. The possible reason why the lifetime of the sample 2 is better than that of the sample 1 having the highest film density is that the sample 1 has a higher film density but has high stress and thus causes film separation, while in the sample 2, the occurrence of film stress is suppressed.

Further, as shown in FIG. 10, in the samples 3 and 4 in each of which the low-density silicon nitride film 14 was deposited, clouding was confirmed due to adhesion of foreign matter A to the surface of the silicon nitride film 14. Further, in the samples 1 and 2 in each of which the high-density silicon nitride film 14 was deposited, the occurrence of a dark spot was confirmed due to low step coverage.

Figure 11:
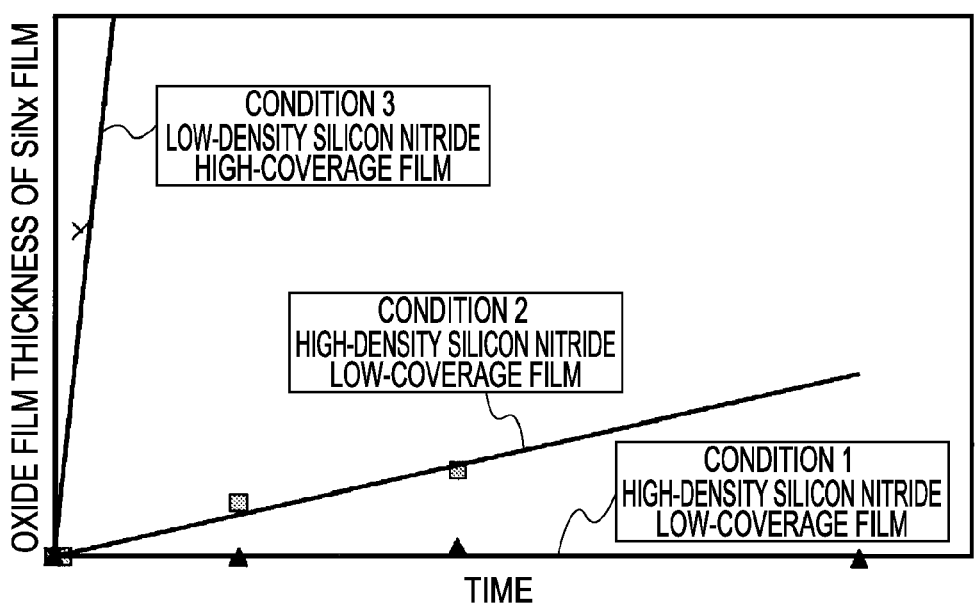
FIG. 11 is a graph showing the oxidation rate of a single silicon nitride film constituting each of samples of a comparative example.

FIG. 11 shows the results of measurement of an oxide film thickness under high-temperature and high-humidity storage conditions with respect to the silicon nitride film 14 constituting each of the samples 1 to 3. This figure indicates that a low-density silicon nitride film (deposited under condition 3) exhibits a high oxidation rate, and the oxidation rate is decreased as the film density is increased. Therefore, it can be said that the present invention described with reference to the embodiment may be configured to include a laminate of silicon nitride films having different oxidation rates.

Example 1

In Example 1, a display 1 having the configuration shown in FIG. 2 was formed. In this example, the protective film 4 was provided by laminating the high-density silicon nitride film 4a formed under the condition 2 of the comparative example, the low-density silicon nitride film 4b formed under the condition 3, and the high-density silicon nitride film 4c formed under the condition 2 in that order. In order to form the protective film 4, the silicon nitride films 4a, 4b, and 4c were continuously deposited by the plasma CVD method.

Figure 12:
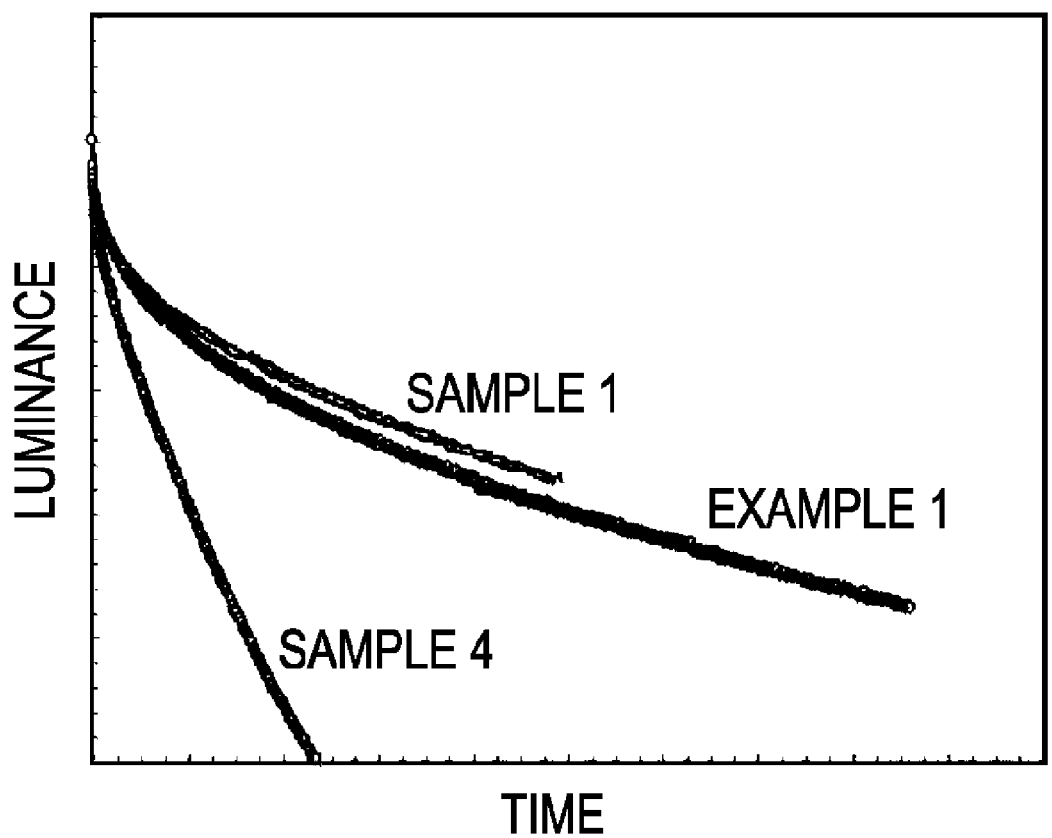
FIG. 12 is a graph showing the deterioration rate (emission lifetime) of luminance of each of a display of Example 1 and samples of a comparative example.

FIG. 12 shows the results of measurement of the life time of the organic electroluminescence devices 3 in the display 1 formed in Example 1. FIG. 12 also shows the lifetimes measured for the samples 1 and 4 of the comparative example.

As shown in FIG. 12, it was confirmed that the display 1 of Example 1 has good lifetime equivalent to that of the sample 1 using the high-density silicon nitride film and maintains good sealing characteristics by the protective film 4.

Also, the occurrence of a dark spot can be suppressed to ½ of the samples 1 and 2 each using the single high-density silicon nitride film having low step coverage. Therefore, it was confirmed that in the display 1 of Example 1, the low step coverage of the high-density silicon nitride films 4a and 4c is compensated by the low-density silicon nitride film 4b. These results of Example 1 are also shown at the bottom of Table 1.

In addition, no foreign matter adhered to the surface of the protective film 4, and clouding was not confirmed.

Further, as a result of measurement of transmittance of the protective film 4 in the display 1 of Example 1, it was confirmed that the transmittance for blue light near wavelength λ=450 nm is improved by 2 times or more as compared with the film structure formed without using an ammonia gas as described in Japanese Unexamined Patent Application Publication No. 2000-223264 cited as a prior document. It was thus confirmed that the display 1 with the configuration of the present invention is suitable for application to a top emission-type full-color display in which emitted light is taken out from the side opposite to the substrate 2.

Therefore, it was confirmed that by applying the configuration of the present invention, it is possible to maintain both good step coverage and good sealing characteristics and protect the organic electroluminescence devices 3 by the protective film 4 with no substance adhering to the surface thereof, thereby preventing deterioration in the organic electroluminescence devices 3 and the occurrence of a dark spot and maintaining good display characteristics due to emitted light which is taken out from the protective film 4 side.

Example 2

In Example 2, a display 1' with the configuration shown in FIG. 3 was formed. In this example, the epoxy resin 5 was applied over the entire surface of the protective film 4 of the display formed in Example 1, and a glass substrate (sealing substrate) 6 was bonded with the epoxy resin 5 used as an adhesive.

As a result of a test in which the display 1' of Example 2 formed described above was exposed in a high-temperature and high-humidity atmosphere of a temperature of 80° C. and a humidity of 75%, moisture penetration between the substrate 2 and the glass substrate 6 was not observed. As a result of the same test of the display 1 of Example 1, a mark of moisture penetration was observed in a portion of silicon nitride (within the protective film 4) 2 mm or more inside the edge of the substrate 2. Therefore, it was confirmed that moisture penetration in the display can be suppressed by bonding the sealing substrate 6 through the resin 5.

Example 3

In Example 3, a display 1 having the configuration shown in FIG. 2 was formed. In this example, the protective film 4 was provided by laminating the high-density silicon nitride film 4a formed under the condition 2 of the comparative example, the low-density silicon nitride film 4b formed under the condition 3, and the high-density silicon nitride film 4c formed under the condition 1 in that order. Namely, the films were deposited under the condition 2/condition 3/condition 1 in the order from the lower layer side. In order to form the protective film 4, the silicon nitride films 4a, 4b, and 4c were continuously deposited by the plasma CVD method.

As a result of a test in which the display 1 of Example 3 formed described above was exposed in a high-temperature and high-humidity atmosphere of a temperature of 80° C. and a humidity of 75%, a mark of moisture was not observed in a portion of silicon nitride (within the protective film 4) 2 mm or more inside the edge of the substrate 2. Therefore, it was confirmed that even if the epoxy resin 5 and the glass substrate (sealing substrate) 6 are not present, moisture penetration in the display can be suppressed by controlling the film density of each of the laminated films which constitute the protective film 4, particularly the film density of the high-density silicon nitride film 4c constituting the surface layer.

Further, an oxide film thickness was measured for the protective film 4 formed in the display 1 of Example 3 under the same high-temperature and high-humidity conditions as those for the silicon nitride films of the samples 1 to 3 formed under the conditions 1 to 3, respectively. As a result, it was confirmed that the oxidation rate is suppressed to the same low level as in the silicon nitride film (sample 1) formed under condition 1 shown in FIG. 11.

The invention claimed is:

1. A display comprising:
a substrate having a display region;
at least one light-emitting device on the substrate within the display region;
a protective film covering the display region and each light-emitting device in the display region, the protective film comprising a plurality of silicon nitride layers,
wherein,
the protective film comprises an uppermost silicon nitride layer, a lowermost silicon nitride layer and a silicon nitride layer between the uppermost and lowermost silicon nitride layers,
the protective film covers an upper light emitting surface and sidewalls of each light emitting device so as to seal in each light-emitting device individually,
the lowermost silicon nitride layer is adjacent each light emitting device and is adjacent the upper light emitting surface and the sidewalls of each light emitting device,
each of the uppermost silicon nitride layer and the lowermost silicon nitride layer has a higher density than that of a the silicon nitride layer between the uppermost silicon nitride layer and the lowermost layer,
the density of each of the uppermost silicon nitride layer and the lowermost silicon nitride layer is $6.2 \times 10^{22}$ atoms/cm$^3$ or greater and the density of the layer between the uppermost silicon nitride layer and the lowermost silicon nitride layer is $5.8 \times 10^{22}$ atoms/cm$^3$ or less, and
the uppermost silicon nitride layer has a density greater than that of the lowermost silicon nitride layer.

2. The display according to claim 1, wherein the uppermost silicon nitride layer is formed during the deposition of a silicon nitride film below the surface layer.

3. The display according to claim 1, wherein light emitted from each light-emitting device is transmitted outward through the protective film.

4. The display of claim 1, comprising a plurality of such light-emitting devices.

5. The display of claim 1, wherein each light-emitting device is an organic-electroluminescent light emitting device with an organic light-emitting layer between an anode and a cathode.

6. The display of claim 1, further comprising a sealing substrate and a resin layer bonding the sealing substrate over the light-emitting devices.

7. The display of claim 1, wherein the uppermost silicon nitride layer has a density of $7.1 \times 10^{22}$ atoms/cm$^3$ or greater.

* * * * *